United States Patent
Lee et al.

(10) Patent No.: US 11,362,336 B2
(45) Date of Patent: Jun. 14, 2022

(54) ELECTROLYTIC COPPER FOIL AND SECONDARY BATTERY USING THE SAME

(71) Applicant: ILJIN MATERIALS CO., LTD., Iksan-si (KR)

(72) Inventors: Sun Hyoung Lee, Iksan-si (KR); Seul-Ki Park, Iksan-si (KR); Tae Jin Jo, Iksan-si (KR); Ki Deok Song, Iksan-si (KR)

(73) Assignee: ILJIN MATERIALS CO., LTD., Iksan-si (KR)

(*) Notice: Subject to any disclaimer, the term of this patent is extended or adjusted under 35 U.S.C. 154(b) by 190 days.

(21) Appl. No.: 16/242,451

(22) Filed: Jan. 8, 2019

(65) Prior Publication Data
US 2019/0355993 A1 Nov. 21, 2019

(30) Foreign Application Priority Data
May 16, 2018 (KR) .................. 10-2018-0055848

(51) Int. Cl.
*H01M 4/66* (2006.01)
*H01M 10/052* (2010.01)
*H01M 10/42* (2006.01)
*H01M 4/02* (2006.01)
*H05K 1/09* (2006.01)

(52) U.S. Cl.
CPC ......... *H01M 4/661* (2013.01); *H01M 10/052* (2013.01); *H01M 10/42* (2013.01); *H01M 2004/021* (2013.01); *H05K 1/09* (2013.01)

(58) Field of Classification Search
CPC ...... H01M 4/66; H01M 4/661; H01M 10/052; H01M 10/42
See application file for complete search history.

(56) References Cited

U.S. PATENT DOCUMENTS

| | | | |
|---|---|---|---|
| 2014/0017564 A1* | 1/2014 | Suzuki ................. | H01M 4/661 429/211 |
| 2014/0045061 A1* | 2/2014 | Suzuki .................... | C22C 1/02 429/211 |
| 2014/0199588 A1* | 7/2014 | Shinozaki ............ | H01M 4/386 429/211 |

(Continued)

FOREIGN PATENT DOCUMENTS

| JP | 2008-13847 A | 1/2008 |
|---|---|---|
| JP | 2008-013847 A | 1/2008 |

(Continued)

OTHER PUBLICATIONS

Korean Office Action dated Oct. 7, 2019, issued to Korean Application No. 10-2018-0055848.

(Continued)

*Primary Examiner* — Karie O'Neill Apicella
(74) *Attorney, Agent, or Firm* — Stein IP, LLC

(57) ABSTRACT

The present disclosure provides an electrolytic copper foil composed of a single layer or a stack of two or more layers, wherein the electrolytic copper foil has Total Organic Carbon (TOC) content equal to or smaller than 4 ppm, and has chlorine (Cl) content equal to or smaller than 10 ppm, wherein the electrolytic copper foil has a thickness, a tensile strength, and an elongation satisfying a relationship 1 below:
relationship 1: thickness (μm)/(tensile strength (kgf/mm$^2$) *elongation (%))≤0.1.

9 Claims, 5 Drawing Sheets

(56) References Cited

U.S. PATENT DOCUMENTS

| | | | |
|---|---|---|---|
| 2016/0260980 A1* | 9/2016 | Lee | H01M 4/661 |
| 2017/0141403 A1* | 5/2017 | Song | H01G 11/28 |
| 2018/0102544 A1 | 4/2018 | Kim et al. | 4/661 |

FOREIGN PATENT DOCUMENTS

| | | |
|---|---|---|
| JP | 2009-138245 A | 6/2009 |
| JP | 2016-160503 A | 9/2016 |
| JP | 2017-195059 A | 10/2017 |
| KR | 10-2017-0001372 A | 1/2017 |
| KR | 10-1733408 B1 | 5/2017 |
| KR | 10-1733409 B1 | 5/2017 |
| KR | 10-2018-0009226 A | 1/2018 |
| KR | 10-2018-0047897 A | 5/2018 |
| TW | 201704487 A | 2/2017 |
| WO | WO 2009/057688 A1 | 5/2009 |
| WO | WO 2017/188600 A1 | 11/2017 |

OTHER PUBLICATIONS

Japanese Office Action dated Oct. 29, 2019, issued to Japanese Application No. 2019-004183.
Taiwanese Office Action dated Jul. 11, 2019, issued to Taiwanese Patent Application No. 108110065.
U.S. Appl. No. 16/343,527, filed Apr. 2019, Sun Hyoung Lee.
U.S. Appl. No. 16/343,500, filed Apr. 2019, Sun Hyoung Lee.
Extended European Search Report dated Sep. 25, 2019, European Application No. 19174768.2.
Chinese Search Report dated Nov. 16, 2021, issued to counterpart Chinese Application No. 201910168119.2.
Chinese Office Action dated Nov. 26, 2021, issued to counterpart Chinese Application No. 201910168119.2.

* cited by examiner

[Erichsen test]

FIG. 7

| Example | single layer | stack of 3 layers | stack of 5 layers |
|---|---|---|---|
| Present Example 3 | | | |
| Present Example 4 | | | |
| Present Example 5 | | | |
| Present Example 6 | | | |
| Comparative Example 1 | | | |
| Comparative Example 2 | | | |

ELECTROLYTIC COPPER FOIL AND SECONDARY BATTERY USING THE SAME

CROSS-REFERENCE TO RELATED APPLICATIONS

This application claims the benefit of Korean Application No. 10-2018-0055848, filed May 16, 2018, in the Korean Intellectual Property Office. All disclosure of the document named above are incorporated herein by reference.

BACKGROUND

1. Field

The present disclosure relates to an electrolytic copper foil and a secondary battery using the same. More particularly, the present disclosure relates to an electrolytic copper foil having both high tensile strength and high elongation, and having high strength. Further, the present disclosure relates to a secondary battery having the electrolytic copper foil to increase a loading level of an anode active material to secure improved safety such as three-dimensional compression characteristics while improving reliability such as capacity efficiency and lifetime characteristics.

2. Description of Related Art

A production of the electrolytic copper foil includes a foil manufacturing process for producing a copper foil using an electroplating method and a post-treatment process for imparting functions to the copper foil through a surface treatment. Such an electrolytic copper foil is advantageous in that it can be easily controlled in terms of thickness and physical properties compared to a conventional copper foil. Accordingly, the electrolytic copper foil may be used as a base material for an electronic device such as a printed circuit board, or as an electrode plate for a secondary battery.

Typically, the electrolytic copper foil is produced in an electrolytic bath. The electrolytic bath may include a cylindrical anode made of titanium (also referred to as a drum), a titanium cathode coated with a lead alloy or iridium oxide while keeping a certain distance from the drum, an electrolytic solution, and a power source. The electrolytic solution includes sulfuric acid and/or copper sulphate. When a direct current flows between the anode and cathode while rotating the cylindrical anode, the copper is electrodeposited to produce the electrolytic copper foil continuously. The process of reducing copper ions into metal by the electrolysis method is referred to the foil manufacturing process.

The copper foil obtained from the foil manufacturing process is subjected to an additional post-treatment process, if necessary, such as, a roughness treatment (nodule) in order to improve the adhesion with the insulating substrate, a diffusion prevention treatment for preventing the diffusion of copper ions, a rust prevention treatment for preventing oxidation from the outside, and a chemical adhesion enhancement treatment to complement the adhesion to the insulation substrate. Such a post-treatment process (surface treatment process) may produce a low profile copper foil for a printed circuit. When only the rust-proof treatment is done in the surface treatment process, the resulting copper foil may be used for the secondary battery.

Meanwhile, the strength of the electrolytic copper foil may be controlled by controlling the materials constituting the electrolytic solution when producing the electrolytic copper foil. In Japanese Patent No. 05588607 (2014 Aug. 1, Mitsui Metal Mining Co., Ltd.), Cl is excessively contained in the electrolytic solution to lower the elongation. In Japanese Patent No. 05373970 (2013 Sep. 27, Mitsui Metal Mining Co., Ltd.), the electrolytic copper foil produced by adding iodine has a curl and has an elongation decrease. In Japanese Patent No. 05771392 (2015 Jul. 3, NIPPON DENKAI KK) and Japanese Patent No. 05595301 (2014 Aug. 15, Nippon Petrochemical Co., Ltd.), the composition of the additives added to the electrolytic solution improves the tensile strength of the electrolytic copper foil, but reduces the elongation such that curl occurs.

In the electrolytic copper foil manufactured by the above-mentioned Japanese patents, in terms of the components of the additives in the electrolyte, Cl content is greater than 35 ppm. When the content of Cl is 35 ppm or larger, there occurs a problem in that in the continuous production, Cl excesses causes corrosion of the electrode and changes in physical properties thereof, thereby deteriorating the continuous productivity. Further, the additive components as described above cause the curl in the electrolytic copper foil. When such an electrolytic copper foil with the curl is used as a secondary battery electrode plate and the active material is coated on the electrode plate, a process failure occurs. Further, when the thickness of the electrolytic copper foil is 12 μm or larger, the electrolytic copper foil has an elongation of 3%. When the thickness of the electrolytic copper foil is below 10 μm, which is the thickness applied to the actual secondary battery, the elongation of the electrolytic copper foil is lowered. When the electrolytic copper foil with the lowed elongation is applied to the secondary battery, there is a problem that the life and safety are lowered and process defects are frequently caused.

Therefore, various studies are being conducted to provide an electrolytic copper foil having high strength and high elongation even at a small thickness.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide an electrolytic copper foil with improved strength and elongation at a small thickness and to provide a secondary battery using the same.

Further, another purpose of the present disclosure is to provide an electrolytic copper foil with improved elongation in multiple directions including 3 axes and to provide a secondary battery using the same.

Further, still another purpose of the present disclosure is to provide an electrolytic copper foil with an increased specific capacity by increasing the loading level of the anode active material, increased reliability and stability, and improved lifetime characteristics, and to provide a secondary battery using the electrolytic copper foil.

Further, still another purpose of the present disclosure is to provide an electrolytic copper foil having a high strength even at a small thickness, and, thus, used as a wiring for a PCB having high electrical performance, and to provide a secondary battery using the electrolytic copper foil.

Furthermore, still another purpose of the present disclosure is to improve a three-dimensional compression characteristic of the electrolytic copper foil to enhance the impact resistance among secondary battery characteristics.

In a first aspect of the present disclosure, there is provided an electrolytic copper foil composed of a single layer or a stack of two or more layers, wherein the electrolytic copper foil has Total Organic Carbon (TOC) content equal to or smaller than 4 ppm, and has chlorine (Cl) content equal to or smaller than 10 ppm, wherein the electrolytic copper foil has a thickness, a tensile strength, and an elongation satisfying a relationship 1 below:

$$\text{thickness } (\mu m)/(\text{tensile strength } (kgf/mm^2)*\text{elongation } (\%)) \leq 0.1. \quad \text{relationship 1}$$

In one embodiment, a breakage height obtained by an Erichsen test when the thickness of the electrolytic copper foil is 35 μm or larger is 3 mm or larger.

In one embodiment, the tensile strength of the electrolytic copper foil is 45 kgf/mm$^2$ or larger, and the elongation of the copper foil is 3% or larger.

In one embodiment, a gloss (Gs (60°)) of the copper foil is 100 or larger.

In a second aspect of the present disclosure, there is provided an anode for a lithium secondary battery, wherein the anode includes an anode current collector, wherein the electrolytic copper foil as defined above is used as the anode current collector such that an anode active material is coated on the electrolytic copper foil at a loading level of 1.0 g/cm$^3$ or greater.

In a third aspect of the present disclosure, there is provided a lithium secondary battery including a battery housing, an electrode assembly and an electrolytic solution, wherein the electrode assembly and electrolytic solution are accommodated in the battery housing, wherein the electrode assembly includes an anode, wherein the anode includes an anode current collector, wherein the electrolytic copper foil as defined above is used as the anode current collector, wherein the anode includes an anode active material coated on the electrolytic copper foil; a cathode electrically connected to the anode and coated with a cathode active material containing a lithium compound; and a separator interposed between the anode and the cathode.

In a fourth aspect of the present disclosure, there is provided a printed circuit board having, on one face thereof, the electrolytic copper foil as defined above.

The effects of the present disclosure are as follows. However, the effects of the present disclosure are not limited to the following.

According to the present disclosure, the electrolytic copper foil with improved strength and elongation at a small thickness, and the secondary battery using the same may be realized.

Further, according to the present disclosure, the electrolytic copper foil with improved elongation in multiple directions including 3 axes and the secondary battery using the same may be realized.

Further, according to the present disclosure, the electrolytic copper foil with an increased specific capacity by increasing the loading level of the anode active material, increased reliability and stability, and improved lifetime characteristics, and a secondary battery using the electrolytic copper foil may be realized.

Further, according to the present disclosure, the electrolytic copper foil having a high strength even at a small thickness, and, thus, used as a wiring for a PCB having high electrical performance, and a secondary battery using the electrolytic copper foil may be realized.

Furthermore, according to the present disclosure, a three-dimensional compression characteristic of the electrolytic copper foil may be improved to enhance the impact resistance among secondary battery characteristics.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 7 shows a result of the Erichsen test with different numbers of overlapping pieces for the Present Examples and the Comparative Examples.

DETAILED DESCRIPTIONS

Figure 1:
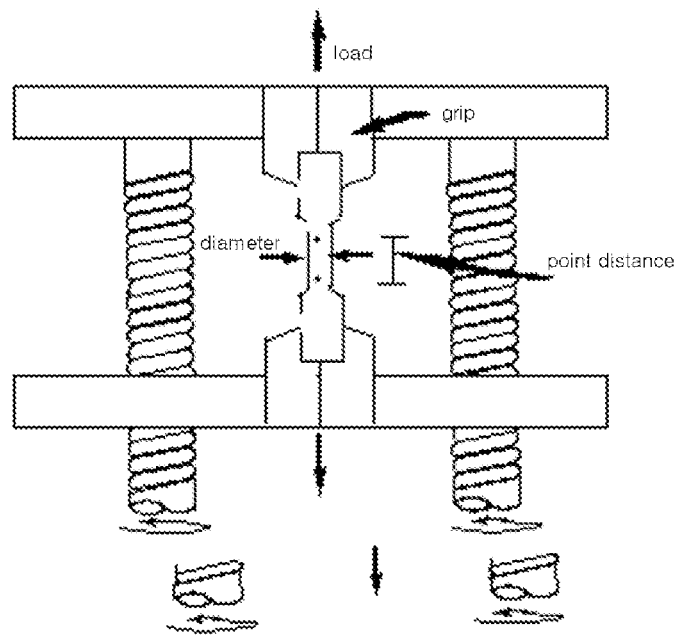
FIG. 1 is a schematic representation of an apparatus for performing a tri-axial multi-directional test on a secondary battery.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

In one embodiment of the present disclosure, an electrolytic copper foil is composed of a single layer or a stack of two or more layers, wherein the electrolytic copper foil has Total Organic Carbon (TOC) content equal to or smaller than 4 ppm, and has chlorine (Cl) content equal to or smaller than 10 ppm, wherein the electrolytic copper foil has a thickness, a tensile strength, and an elongation satisfying a relationship 1 below:

thickness (μm)/(tensile strength (kgf/mm$^2$)*elongation (%))≤0.1.    relationship 1

The electrolytic copper foil may be formed by the electrolytic plating. The electrolytic copper foil may be formed into an electrolytic copper foil laminate formed by laminating at least one layer of the electrolytic copper foil such that the foil laminate has a thickness of 35 μm or larger. A breakage height obtained by an Erichsen test when the thickness of the electrolytic copper foil laminate is 35 μm or larger is 3 mm or larger.

In recent years, with the tendency to miniaturize and lighten the secondary battery, the loading level of the anode active material increases for a high energy density of the secondary battery. As the loading level increases, the anode current collector thickness is reduced. On the other hand, due to the tensile strength, elongation and toughness of the electrolytic copper foil for the conventional anode current collector, there is a limit to manufacture the anode having the high energy density. In this connection, the anode active material may include natural graphite, artificial graphite, hard carbon, soft carbon, Si Alloy, Si oxide, Si—C, Si, Sn metal layers, and Li metal layers.

Further, as the thickness of the electrolytic copper foil used as the anode current collector decreases, The toughness of the anode collector is lowered. As a result, in the process of manufacturing the anode, cracks are formed in the anode or the anode is deformed during the rolling process. Further, when the anode manufactured to have an excessive energy density is used in the secondary battery, heat is generated due to an increase in internal resistance due to the cracks or deformation of the anode in a process of reversibly charging and discharging of the battery, which poses a problem of safety.

For secondary batteries for automobiles with high energy density, there is a safety test for compression and penetration. This safety test is highly dependent on the properties of the electrolytic copper foil. Therefore, when the elongation of the secondary battery is measured, the conventional test of pulling the battery in one axis is not carried out, but the safety test of pulling the battery in three directions is being carried out. Three-dimensional elongation plays an important role in the triaxial test in the multiple directions.

In the case of the conventional electrolytic copper foil, when the loading level of the anode active material is increased due to the low tensile strength and toughness, defective deformation due to cracks, burrs, or the like occurred. When the tensile strength is increased to solve this problem, there occur a failure in the multi-directional test of the three-axes for the secondary battery.

The electrolytic copper foil may be manufactured using the following electrolytic solution. The electrolytic solution may contain a copper content of 60 to 120 g/L, a sulfuric acid content of 50 to 200 g/L, a chlorine content of 5 to 30 ppm and a TOC content of 10 ppm or larger. The electrolytic solution may further contain at least one of additive A, additive B, additive C, and additive D as follows.

The additive A is at least one selected from the group consisting of thiourea compounds and compounds in which a thiol group is bonded to a heterocycle containing nitrogen.

The additive B is a sulfonic acid of a compound containing a sulfur atom or a metal salt thereof. The additive B may include bis-(3-sulfopropyl)-disulfide disodium salt, 3-mercapto-1-propanesulfonic acid, 3-(N, N-dimethylthiocarbamoyl)-thiopropanesulfonate sodium salt, 3-[(amino-iminomethyl)thio]-1-propanesulfonate sodium salt, or o-ethyldithiocarbonate-S-(3-sulfopropyl)-ester sodium salt.

The additive C is a sulfonic acid or a metal salt of a compound containing a sulfur atom, excluding the additive B. The additive C comprises a thiourea and a thiourea derivative. The additive C may include 2-mercapto-5-benzimidazole sulfonic acid, 3(5-mercapto-1H-tetrazolyl) benzenesulfonate, or 3-(benzothiazolyl-2-mercapto)-propylsulfonic acid sodium salt.

The additive D is a nonionic water-soluble polymer. The additive D is selected from the group consisting of glue, gelatin, polyethylene glycol, polypropylene glycol, starch, polymeric polysaccharides such as cellulosic water-soluble polymers (carboxymethylcellulose, hydroxyethylcellulose and the like), polyethyleneimine, polyacrylamide, etc.

The thiourea and thiourea derivatives may be the soluble thiourea, and thiourea derivatives which may be selected from the group consisting of thiourea ($CH_4N_2S$), N,N'-dimethyl thiourea ($C_3H_8N_2S$), N, N'-diethylthiourea ($C_5H_{12}N_2S$), tetramethyl thiourea ($C_5H_{12}N_2S$), thiosemicarbazide ($CH_5N_3S$), N-allyl thiourea ($C_4H_8N_2S$), or ethylene thiourea ($C_3H_6N_2S$), etc.

These additive A, B, C, and D are not necessarily limited to those above. Any may be used as an additive in the related art.

Figure 2:
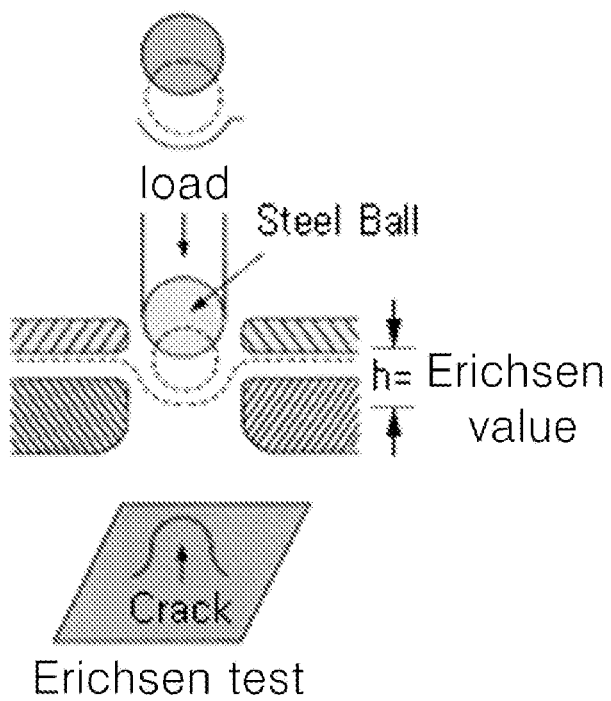
FIG. 2 is a schematic representation of an Erichsen test for an electrolytic copper foil.

FIG. 1 is a schematic representation of an apparatus for performing a tri-axial multi-directional test on a secondary battery. FIG. 2 is a schematic representation of an Erichsen test for an electrolytic copper foil.

Referring to FIG. 1 and FIG. 2, the three-axial multi-directional test for the secondary battery may be embodied as the Erichsen test for electrolytic copper foil. When the electrolytic copper foil according to the embodiment of the present disclosure is subjected to the Erichsen test corresponding to the three-axial multi-directional test, the breakage height by which the electrolytic copper foil is broken is increased. Accordingly, the secondary battery including the electrolytic copper foil according to the present embodiment may have improved the strength and three-axial elongation in the three-axial multi-directional test, thereby to increase the safety. Among the Erichsen tests as described in KS B 0812, ISO 1520, the Erichsen test in accordance with the present example employs the B test to apply a wrinkle preventing force of 0.8066 KN, which is a test method other than the material specification.

The electrolytic copper foil according to the embodiment is used as an anode current collector constituting an anode for a secondary battery. In this regard, when the breakage height in the Erichsen test is smaller than 3 mm, the secondary battery using the electrolytic copper foil as an anode current collector has a low tensile strength and three-axial elongation, which is a problem in terms of the safety of the secondary battery. The Erichsen test was carried out on the basis of KS B 0812 and ISO 8490.

Figure 3:
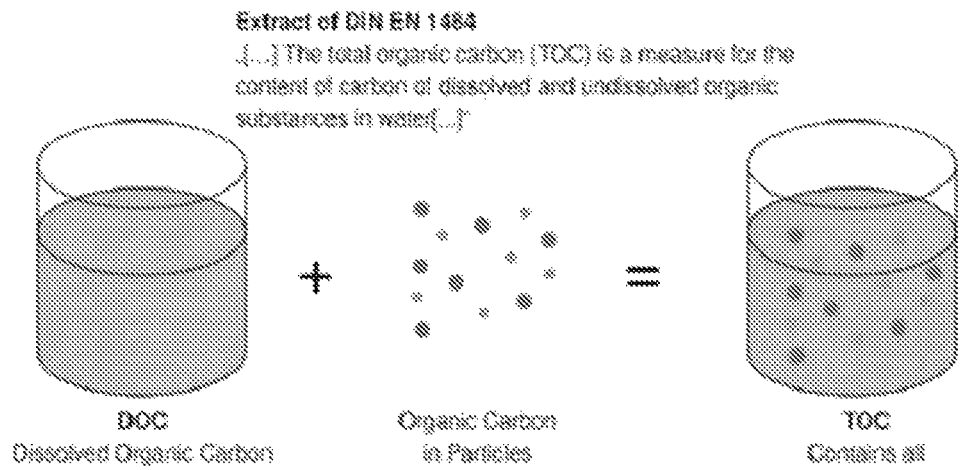
FIG. 3 is a schematic view for explaining TOC described in an embodiment of the present disclosure.

FIG. 3 is a schematic view for describing the TOC as described in an embodiment of the present disclosure. The electrolytic copper foil has a TOC (total organic carbon) content of 4 ppm or smaller and a Cl (chlorine) content of 10 ppm or smaller.

Referring to FIG. 3, the TOC stands for Total Organic Carbon and is specified in DIN EN 1484 specification.

The TOC is included in the copper electrolytic solution and serves to reduce the internal grain size of the electrolytic copper foil. To the contrary, there may be dissolved carbon dioxide (called Total Inorganic Carbon: TIC) in the copper electrolytic solution, rather than the TOC. In this case, when the battery is left at a high temperature for a long time in the vacuum drying step during the manufacturing process of the battery, the additives present in the grain are diffused into the grain boundary, causing abnormal growth of grain and change of the crystal structure. Further, the change in the physical properties of the electrolytic copper foil after the vacuum drying changes the adhesion force and stress between the electrolytic copper foil and the anode active material, thereby causing the anode active material to be removed and to have cracks during charging and discharging of the secondary battery.

As described above, the TOC generates impurities in the grain boundaries, thereby suppressing the abnormal growth of crystal grains and increasing the tensile strength. On the other hand, when the content of TOC in the electrolytic copper foil exceeds 4 ppm, the elongation is degraded. Thus, when the anode active material is coated on the electrolytic copper foil, cracks are generated or the electrolytic copper foil is broken.

Further, when the content of Cl in the electrolytic copper foil is larger than 10 ppm, the cycle characteristics of the secondary battery using the electrolytic copper foil are degraded and the moldability for the Erichsen test is reduced. Thus, there is a problem with the safety of the secondary battery. Thus, preferably, the TOC content is 4 ppm or smaller, and the Cl content is 10 ppm or smaller. In this case, the electrolytic copper foil may be used as the anode current collector having a high density. This improves the life characteristics and stability of the secondary battery.

In one embodiment, the electrolytic copper foil has a thickness of 2 μm to 35 μm. The electrolytic copper foil may be composed of a single layer or a stack of two or more layers, wherein the electrolytic copper foil has Total Organic Carbon (TOC) content equal to or smaller than 4 ppm, and has chlorine (Cl) content equal to or smaller than 10 ppm, wherein the electrolytic copper foil has a thickness, a tensile strength, and an elongation satisfying a relationship 1 below:

$$\text{thickness (μm)/(tensile strength (kgf/mm}^2\text{)*elongation (\%))} \leq 0.1. \quad \text{relationship 1}$$

When the thickness of the electrolytic copper foil is smaller than 2 μm, cracks are generated in the foil or the foil is deformed in the process of coating the anode active material on the electrolytic copper foil and rolling the foil. Further, there is a problem that the electrolytic copper foil is sagged in the process of coating the anode active material on the electrolytic copper foil using a roll. Thus, mass production may be difficult. n the other hand, if the thickness of the electrolytic copper foil is greater than 35 μm, and when the electrolytic copper foil is used as the anode current collector, the volume of the portion where no electric energy is generated is increased to lower the unit capacity of the secondary battery.

Further, the tensile strength and elongation depend on the thickness of the electrolytic copper foil. Therefore, the tensile strength and elongation have a trade-off relationship with the thickness of the electrolytic copper foil. Therefore, it is preferable that the tensile strength and the elongation and thickness of the electrolytic copper foil comply with the Relationship 1. When, in the Relationship 1, thickness (μm)/(tensile strength (kgf/mm$^2$)*elongation (%))>0.1, the breakage height is decreased in the above Erichsen test, resulting in the problematic elongation in the three-axial deformation.

The tensile strength of the electrolytic copper foil is 30 kgf/mm$^2$ or larger and the elongation thereof is 3% or larger.

When the tensile strength of the electrolytic copper foil is below 30 kgf/mm$^2$, problems such as deformation and burr occur when the loading level of the anode active material on the electrolytic copper foil is increased.

Further, when the elongation is below 3%, there is a problem that cracks are generated in the electrolytic copper foil in the course of coating the anode active material on the foil and rolling the foil.

The electrolytic copper foil has a gloss (Gs (60°)) of 100 or larger.

When the gloss (Gs (60°)) of the electrolytic copper foil is smaller than 100, the anode active material is not uniformly coated due to surface roughness of the electrolytic copper foil.

The electrolytic copper foil may be used as an anode current collector for a lithium secondary battery. The loading level of the anode active material coated on one face of the anode current collector is 1.0 g/cm$^3$ or larger. The thickness of the electrolytic copper foil except the anode active material is larger than or equal to 2 μm.

If the thickness of the electrolytic copper foil is smaller than 2 μm, this cannot stably support the high loading level of the anode active material. If the thickness exceeds 35 μm, increasing the volume of the secondary battery may disallow a small and slim secondary battery, and may decrease the specific capacity of the secondary battery.

Further, the loading level of the anode active material may depend on the thickness of the electrolytic copper foil. When the loading level of the anode active material within the thickness range described above is 1.0 g/cm$^3$ or larger, this generates electric energy efficiently while maintaining safety.

According to another embodiment of the present disclosure, the present disclosure provides a secondary battery using the electrolytic copper foil as described above. The secondary battery uses the electrolytic copper foil as an anode current collector. The battery includes an anode having the anode current collector as the electrolytic copper foil and an anode active material coated on the anode current collector as the electrolytic copper foil.

The secondary battery may include a battery housing, and an electrode assembly and an electrolytic solution accommodated in the battery housing. The electrode assembly may include the anode; a cathode electrically connected to the anode and coated with a cathode active material containing a lithium compound; and a separator interposed between the anode and the cathode.

The present disclosure may include an electronic device using the secondary battery, and further includes a vehicle using the secondary battery.

According to another embodiment of the present disclosure, the present disclosure includes an electrolytic copper foil as described above and a printed circuit board having, on one side thereof, the electrolytic copper foil. Further, the present disclosure includes an electronic apparatus using the printed circuit board.

Hereinafter, referring to FIG. 4, another embodiment of the present disclosure is described. Except for following descriptions, contents of a following embodiment is similar to those described in the previous embodiment described in conjunction with FIG. 1 to FIG. 3. Thus, a detailed description thereof will be omitted.

Figure 4:
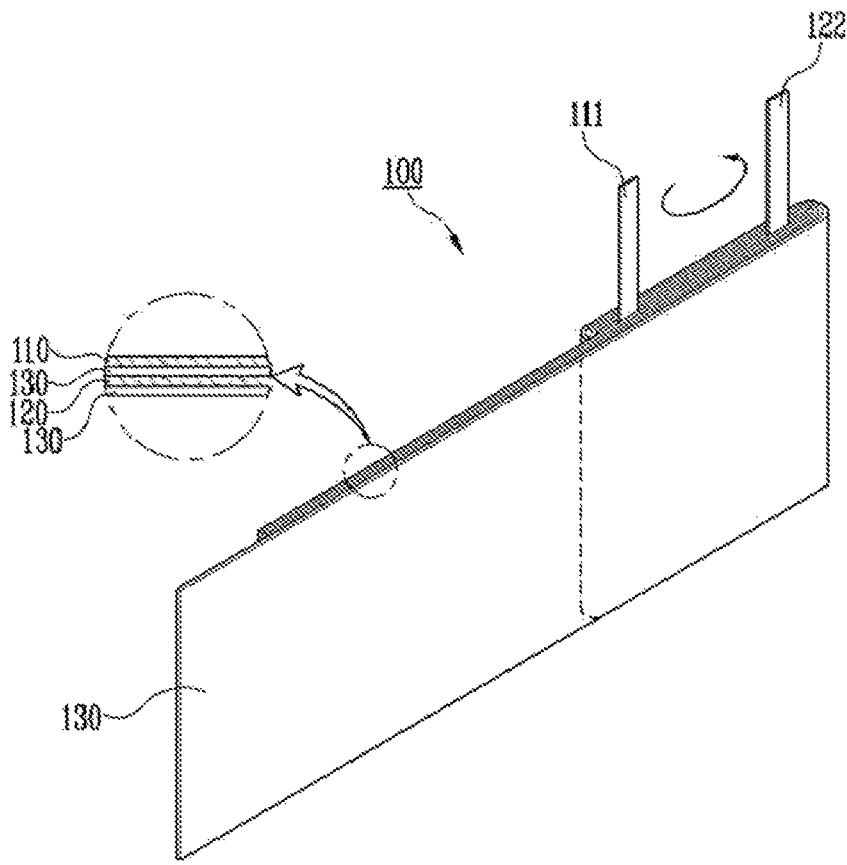
FIG. 4 is a schematic view of an electrode assembly manufactured using an electrolytic copper foil for a secondary battery as an anode current collector according to another embodiment of the present disclosure.

FIG. 4 is a schematic view of an electrode assembly manufactured using an electrolytic copper foil for a secondary battery as an anode current collector according to another embodiment of the present disclosure.

Referring to FIG. 4, the secondary battery may include a battery housing, and an electrode assembly 100 and an electrolytic solution accommodated in the battery housing. The electrode assembly 100 may include an anode 110, wherein the anode 110 includes an anode current collector, wherein the electrolytic copper foil as defined above is used as the anode current collector, wherein the anode 110 includes an anode active material coated on the electrolytic copper foil; a cathode 120 electrically connected to the anode and coated with a cathode active material containing a lithium compound; and a separator 130 interposed between the anode and the cathode.

The loading level of the anode active material is at least 1.0 g/cm$^3$, and the thickness of the electrolytic copper foil excluding the anode active material is at least 2 μm.

Electrode tabs 111 and 122 are welded to the anode 110 and the cathode 120, respectively and thus are connected to electrode terminals provided in the battery housing or function as electrode terminals themselves.

The cathode 120 may be prepared as follows: a lithium compound, a conductive agent, a binder, and a solvent may be mixed to prepare a slurry-form cathode active material composition. Then, the cathode active material composition is directly coated and dried on an aluminum current collector, which is a cathode current collector, to prepare a cathode plate having the cathode active material coated thereon. Alternatively, the cathode active material composition may be cast on a separate support. Then, a film obtained by peeling off the composition from the support is laminated on the aluminum current collector, to prepare a cathode 120 plate having the cathode active material formed thereon.

The anode 110 is manufactured as follows. The anode 110 is manufactured in the same manner as that of the cathode 120 except that the anode active material is used. Further, conductive materials, binders and solvents in the anode active material composition may be the same as those as used for the cathode 120.

In one example, the anode 110 may be prepared as follows: an anode active material, a conductive agent, a binder, and a solvent may be mixed to prepare a slurry-form anode active material composition. Then, the anode active material composition is directly coated and dried on the copper foil as defined above, which is a anode current collector, to prepare a anode plate having the anode active material coated thereon. Alternatively, the anode active material composition may be cast on a separate support. Then, a film obtained by peeling off the composition from the support is laminated on the copper foil as the anode current collector, to prepare a anode 120 plate having the anode active material formed thereon.

Next, the separator 130 to be inserted between the anode 110 and the cathode 120 is prepared. The separator may be available as long as the same is commonly used in a lithium battery. The separator 130 may have a low resistance against the electrolytic ion migration in the electrolytic solution and may have excellent electrolytic solution wetting ability.

Next, the electrolytic solution is prepared. For example, the electrolytic solution may contain a small amount of additive in addition to the lithium salt in the organic electrolytic solution.

The anode 110 and the cathode 120 are wound or folded while the separator 130 is interposed therebetween and are housed in the battery housing. The battery housing may be a square or cylindrical can type or a pouch type.

The electrode assembly 100 composed of the anode 110, the cathode 120 and the separator 130 as described above, the electrolytic solution and the battery housing are all available as long as they may be used as components of the secondary battery in the art.

According to another aspect of the present disclosure, the present disclosure further includes electronic devices and automobiles using secondary batteries as described above.

The Present and the Comparative Examples in the present disclosure are described below. However, the following Present Examples are merely preferred examples of the present disclosure, and the scope of the present disclosure is not limited by the following Present Examples.

1. Manufacture of Electrolytic Copper Foil

An electrolytic copper foil having a thickness as shown in Table 1 was prepared in an electrolytic bath having a copper-based substrate and containing an electrolytic solution of copper sulfate having a following composition:

(1) Copper Sulfate Electrolytic Solution
Copper content: 60 to 120 g/L
Sulfuric acid content: 50 to 200 g/L
Chlorine content: 5 to 30 ppm
TOC content: 10 ppm or larger
(2) Condition of Electrolytic Bath
Temperature of electrolytic solution: 40° C. to 70° C.
Current density: 20 A/dm$^2$ to 100 A/dm$^2$

TABLE 1

| | Thickness(μm) | Additive A (ppm) | Additive B (ppm) | Additive C (ppm) | Additive D (ppm) | DDAC (ppm) | TOC in Electrolytic solution (ppm) | Cl in electrolytic solution (ppm) |
|---|---|---|---|---|---|---|---|---|
| Present Example 1 | 6 | 11 | 60 | 20 | 30 | | 1000 | 30 |
| Present Example 2 | 8 | 12 | 70 | 10 | 20 | | 800 | 30 |
| Present Example 3 | 35 | 11 | 100 | 5 | 5 | | 500 | 19 |
| Present Example 4 | 35 | 1 | 60 | 40 | 10 | | 10 | 5 |
| Present Example 5 | 35 | 3 | 60 | 40 | 10 | | 100 | 10 |
| Comparative Example 1 | 35 | | 21.1 | 13.8 | | 52.3 | | 66 |
| Comparative Example 2 | 50 | 3.4 | 60 | | | | 70 | 60 |

Additive A: N,N'-diethylthiourea, Additive B: 3-mercapto-1-propanesulfonic acid, Additive C: 3-(benzothiazolyl-2-mercapto)-propyl-sulfonic acid sodium salt, Additive D: polyethylene glycol (MW 1000).

2. Measurement of TOC and Cl Contents

As shown in Table 1, 2.9 g of the prepared electrolytic copper foil was completely dissolved in the persulfate film solution, and then TOC content was measured, and Cl content was measured by ICP.

The TOC content was measured by TOC-V equipment commercially available from Shimadzu Corporation in Japan according to DIN EN 1484: 1997 regulation. The Cl content was measured by ICS-1000 equipment commercially available from Dionex Co., Ltd. in Japan according to IPC TM 650 regulation.

TABLE 2

| | TOC in electrolytic copper foil (ppm) | Cl in electrolytic copper foil (ppm) |
|---|---|---|
| Present Example 1 | 3 | 4 |
| Present Example 2 | 2.8 | 4 |
| Present Example 3 | 2.59 | 3.57 |
| Present Example 4 | 0.5 | 0.1 |
| Present Example 5 | 1.5 | 0.9 |
| Comparative Example 1 | 5 | 11 |
| Comparative Example 2 | 4.7 | 10.8 |

3. Erichsen Test Measurement

Figure 5:
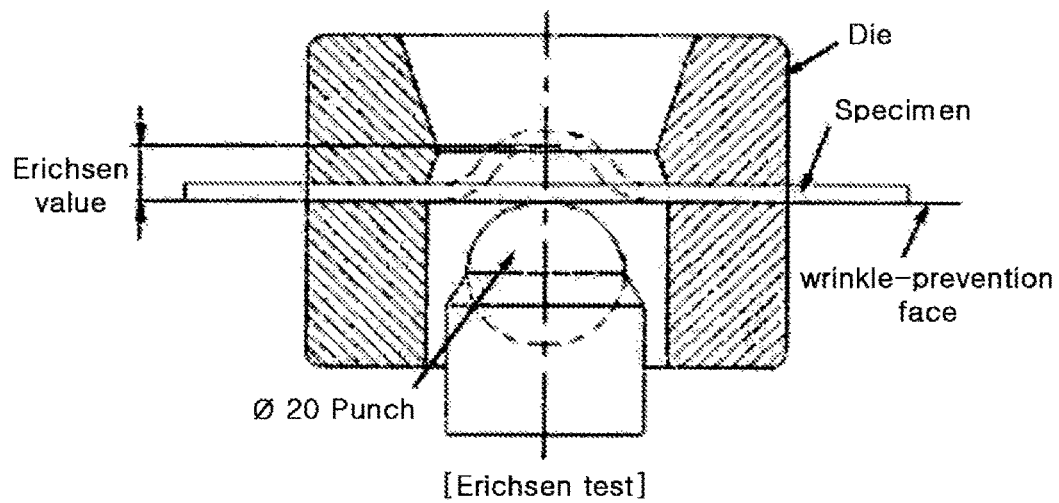
FIG. 5 and FIG. 6 show an equipment that performs the Erichsen test according to one embodiment.
Figure 6:
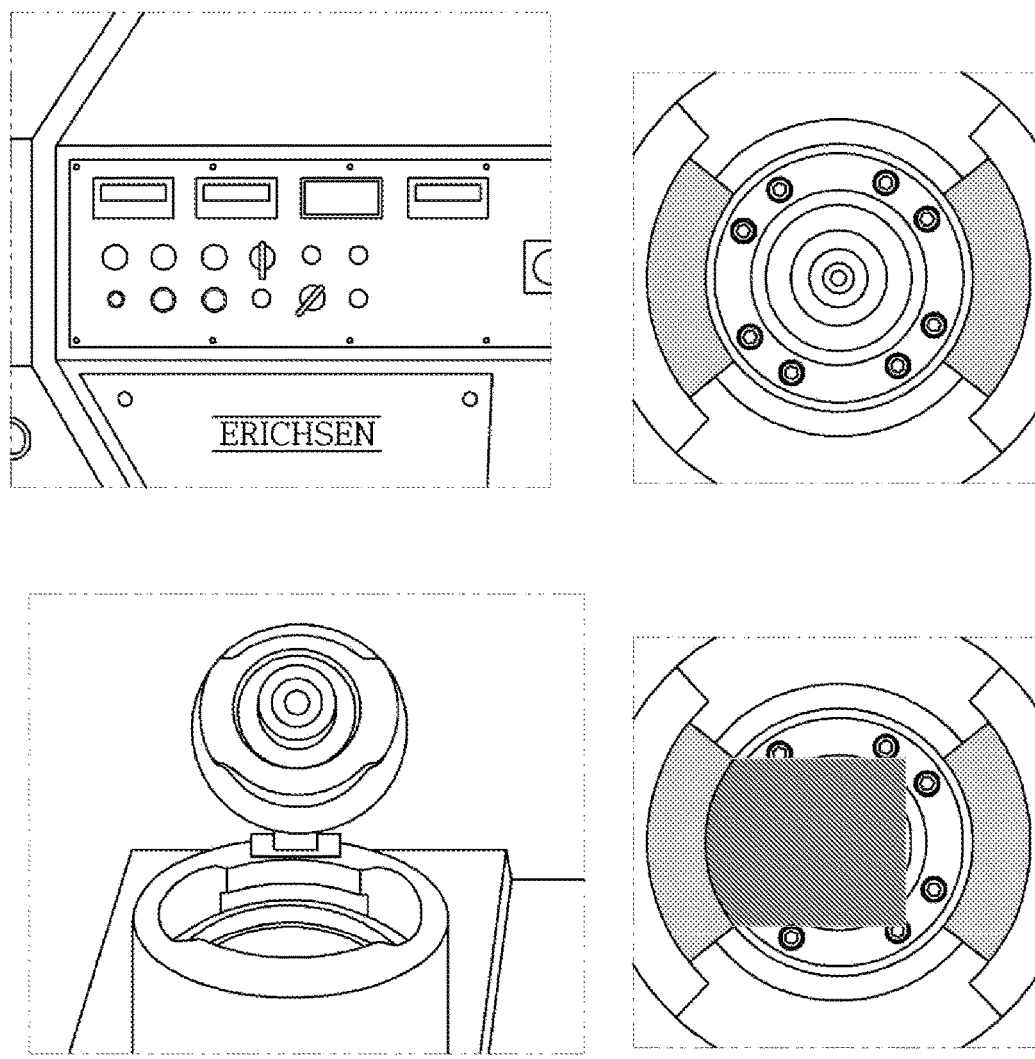

The Erichsen test was performed using the equipment shown in FIG. 5 and FIG. 6. The Erichsen test is the oldest and most widely deployed test method for formability testing. In this test, the electrolytic copper foil was prepared as a specimen. A punch was pressed against the specimen for each Present Example to measure, as the Erichsen value, the breakage height (mm) to the fracture. Measuring methods and standards were carried out with reference to KS B 0812 and ISO 8490.

(1) Test Conditions

Load: 10 kN

Punch moving speed: 10 mm min

Sphere size: ϕ20

(2) Erichsen Test Result, and Breakage Height Measurement Method

Measure the height when the fracture occurs (see FIG. 4)

4. Secondary Battery Compression Test

The secondary battery compression test was conducted in accordance with JIS C8714 standard.

TABLE 3

| | Room temperature measurement | | | | 200° C. measurement | |
|---|---|---|---|---|---|---|
| | Thickness(μm) | Tensile strength (kgf/mm$^2$) | Elongation(%) | Thickness/tensile strength * elongation | Tensile strength (kgf/mm$^2$) | Elongation (%) |
| Present Example 1 | 6 | 95.2 | 3.8 | 0.016585582 | 90.4 | 3.1 |
| Present Example 2 | 8 | 96.6 | 4.8 | 0.017253278 | 92.8 | 4.1 |
| Present Example 3 | 35 | 91.4 | 5.1 | 0.075084738 | 75.9 | 3.6 |
| Present Example 4 | 35 | 46.4 | 11 | 0.068573668 | 45.1 | 10 |
| Present Example 5 | 35 | 47.1 | 10.9 | 0.068174292 | 42.0 | 11.1 |
| Comparative Example 1 | 35 | 70.8 | 1.5 | 0.329566855 | 67.1 | 1.5 |
| Comparative Example 2 | 50 | 95.4 | 3.8 | 0.137923425 | 83.5 | 4.8 |

TABLE 4

|  | Thickness(μm) | Number of stacked electrolytic copper foils | Erichsen test | Battery compression test |
|---|---|---|---|---|
| Present Example 1 | 6 | 6 | 3.5 mm | Pass |
| Present Example 2 | 8 | 5 | 3.2 mm | Pass |
| Present Example 3 | 35 | 1 | 3.3 mm | Pass |
| Present Example 4 | 35 | 1 | 3.9 mm | Pass |
| Present Example 5 | 35 | 1 | 4.0 mm | Pass |
| Comparative Example 1 | 35 | 1 | 2.8 mm | NG |
| Comparative Example 2 | 50 | 1 | 2.9 mm | NG |

Figure 8:
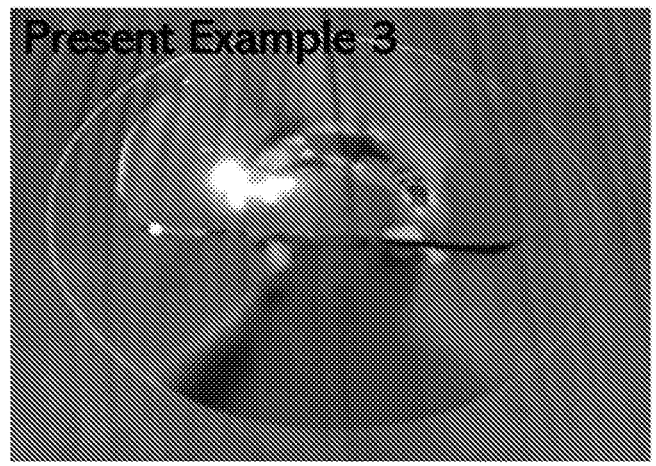
FIG. 8 is an enlarged view of Present Examples 3 and 4 and Comparative Example 2 in FIG. 7.
Figure 8:
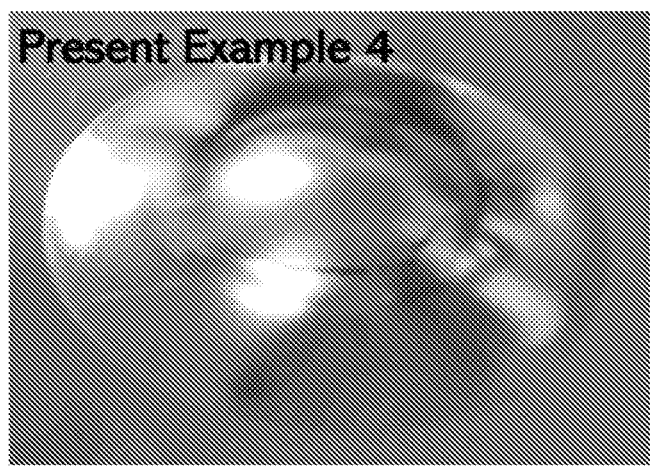
Figure 8:
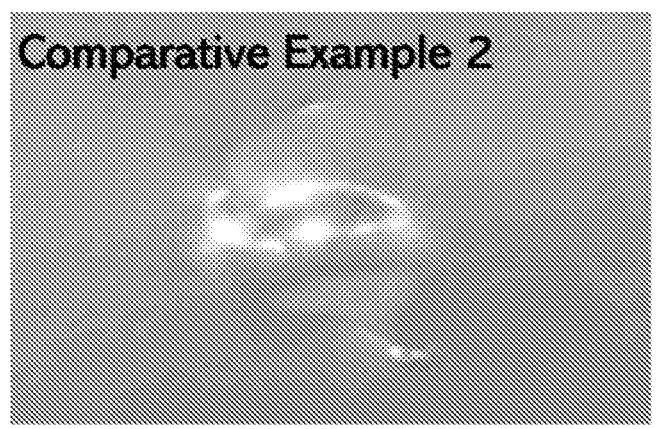

FIG. 7 shows a result of the Erichsen test with different numbers of overlapping pieces for the Present Examples and the Comparative Examples. FIG. 8 is an enlarged view of Present Examples 3 and 4 and Comparative Example 2 in FIG. 7.

Referring to the above-described Present Examples and Comparative Examples, the Comparative Example 1 shows a case where the thickness is 35 μm. The Comparative Example 1 exhibited a poor Erichsen test result compared to the Present Example 3 or Present Example 5 having different thicknesses. Further, for the Comparative Example 2 having the thickness 50 μm, the result of the Erichsen test thereof was poor compared to the Present Example 3 or Present Example 5 and the battery compression test thereof was poor compared to the Present Example 3 or Present Example 5.

Those of ordinary skill in the art to which the present disclosure belongs may understand that the present disclosure may be embodied in other specific forms without departing from the spirit or essential characteristics thereof. It is to be understood, therefore, that the presently described embodiments are to be considered in all respects as illustrative and not restrictive. The scope of the present disclosure is defined by the appended claims rather than the above detailed descriptions. All changes or modifications that come within the meaning and range of equivalency of the claims, and equivalents thereof, are to be interpreted as being included within the scope of the present disclosure.

What is claimed is:

1. An electrolytic copper foil composed of a single layer or a stack of two or more layers, wherein the electrolytic copper foil has Total Organic Carbon (TOC) content of 0.5 to 3 ppm, and has chlorine (Cl) content of 0.1 to 4 ppm, wherein the electrolytic copper foil has a thickness, a tensile strength, and an elongation satisfying a relationship 1 below, and wherein a breakage height obtained by an Erichsen test when the thickness of the electrolytic copper foil during the Erichsen test is 35 μm or larger is 3 mm or larger, wherein a gloss (Gs(60°)) of the copper foil is equal to or greater than 100:

$$\text{thickness}(\mu m)/(\text{tensile strength}(kgf/mm^2) * \text{elongation}(\%)) \le 0.1, \quad \text{relationship 1}$$

wherein the tensile strength of the electrolytic copper foil is 45 to 96.6 kgf/mm², and the elongation of the copper foil is 3 to 11%.

2. An anode for a lithium secondary battery, wherein the anode includes an anode current collector, wherein the electrolytic copper foil of claim 1 is used as the anode current collector such that an anode active material is coated on the electrolytic copper foil at a loading level of 1.0 g/cm³ or greater.

3. A lithium secondary battery including a battery housing, an electrode assembly and an electrolytic solution, wherein the electrode assembly and electrolytic solution are accommodated in the battery housing,
wherein the electrode assembly includes:
an anode, wherein the anode includes an anode current collector, wherein the electrolytic copper foil of claim 1 is used as the anode current collector, wherein the anode includes an anode active material coated on the electrolytic copper foil;
a cathode electrically connected to the anode and coated with a cathode active material containing a lithium compound; and
a separator interposed between the anode and the cathode.

4. A printed circuit board having, on one face thereof, the electrolytic copper foil of claim 1.

5. An anode for a lithium secondary battery, wherein the anode includes an anode current collector, wherein the electrolytic copper foil of claim 1 is used as the anode current collector such that an anode active material is coated on the electrolytic copper foil at a loading level of 1.0 g/cm³ or greater.

6. A lithium secondary battery including a battery housing, an electrode assembly and an electrolytic solution, wherein the electrode assembly and electrolytic solution are accommodated in the battery housing,
wherein the electrode assembly includes:
an anode, wherein the anode includes an anode current collector, wherein the electrolytic copper foil of claim 1 is used as the anode current collector, wherein the anode includes an anode active material coated on the electrolytic copper foil;
a cathode electrically connected to the anode and coated with a cathode active material containing a lithium compound; and
a separator interposed between the anode and the cathode.

7. A printed circuit board having, on one face thereof, the electrolytic copper foil of claim 1.

8. The electrolytic copper foil according to claim 1, wherein the electrolytic copper foil consists essentially of Total Organic Carbon (TOC) content of 0.5 to 3 ppm and chlorine (Cl) content of 0.1 to 4 ppm.

9. The electrolytic copper foil according to claim 8, wherein the electrolytic copper foil consists of Total Organic Carbon (TOC) content of 0.5 to 3 ppm and chlorine (Cl) content of 0.1 to 4 ppm.

* * * * *